United States Patent
Koizumi et al.

(10) Patent No.: US 10,394,134 B2
(45) Date of Patent: Aug. 27, 2019

(54) EXPOSURE METHOD, EXPOSURE APPARATUS, AND METHOD OF MANUFACTURING ARTICLE

(71) Applicant: CANON KABUSHIKI KAISHA, Tokyo (JP)

(72) Inventors: Ryo Koizumi, Saitama (JP); Tadao Nakamura, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/050,203

(22) Filed: Jul. 31, 2018

(65) Prior Publication Data
US 2019/0041759 A1 Feb. 7, 2019

(30) Foreign Application Priority Data
Aug. 3, 2017 (JP) ................. 2017-151033

(51) Int. Cl.
*G03F 7/20* (2006.01)

(52) U.S. Cl.
CPC .......... *G03F 7/70591* (2013.01); *G03F 7/705* (2013.01); *G03F 7/706* (2013.01); *G03F 7/70891* (2013.01)

(58) Field of Classification Search
CPC ...... G03F 7/705; G03F 7/70591; G03F 7/706; G03F 7/70891
USPC ........................ 355/30, 67, 68, 77
See application file for complete search history.

(56) References Cited

U.S. PATENT DOCUMENTS

| | | | |
|---|---|---|---|
| 4,801,977 A | 1/1989 | Ishizaka et al. | |
| 5,953,106 A * | 9/1999 | Unno | G03F 7/70891 250/370.15 |
| 7,262,831 B2 | 8/2007 | Akhssay et al. | |
| 2008/0291412 A1* | 11/2008 | Kazinczi | G03F 7/70891 355/52 |
| 2009/0028421 A1* | 1/2009 | Sukegawa | G03F 7/70425 382/144 |
| 2010/0124724 A1* | 5/2010 | Hoshino | G03B 27/52 430/325 |
| 2014/0204353 A1* | 7/2014 | Ozawa | G03F 7/705 355/52 |

FOREIGN PATENT DOCUMENTS

| | | |
|---|---|---|
| JP | S63058349 A | 3/1988 |
| JP | 2006157020 A | 6/2006 |

* cited by examiner

*Primary Examiner* — Colin W Kreutzer
(74) *Attorney, Agent, or Firm* — Rossi, Kimms & McDowell LLP

(57) ABSTRACT

The present invention provides an exposure method for repeatedly performing an exposure process for exposing a substrate via a projection optical system, the method comprising a first exposure process for measuring optical characteristics of the projection optical system, and exposing the substrate while correcting the optical characteristics based on a result of the measurement; a second exposure process for exposing the substrate while correcting the optical characteristics based on a result of estimating the optical characteristics by a prediction formula, wherein the first exposure process is repeatedly performed, and the second exposure process is started after the first exposure process where it is judged that the determined coefficient of the prediction formula has converged.

12 Claims, 6 Drawing Sheets

EXPOSURE METHOD, EXPOSURE APPARATUS, AND METHOD OF MANUFACTURING ARTICLE

BACKGROUND OF THE INVENTION

Field of the Invention

The present invention relates to an exposure method, an exposure apparatus, and a method of manufacturing an article.

Description of the Related Art

As one apparatus used in a manufacturing process (a lithography process) such as for a semiconductor device, an exposure apparatus for exposing a substrate via a projection optical system and transferring a pattern of a mask onto the substrate is known. In the exposure apparatus, because a portion of the exposure light is absorbed in the projection optical system, optical characteristics of the projection optical system fluctuate by the influence of heat generated thereby, and transferring the pattern of the mask onto the substrate with good accuracy can be difficult.

Japanese Patent Laid-Open No. S63-58349 proposes a method for predicting optical characteristics of a projection optical system using a prediction formula (a model formula) that takes as variables an exposure amount, an exposure time, or the like, and controls the optical characteristics of the projection optical system based on prediction values thereof Japanese Patent Laid-Open No. S63-58349 also proposes a method for, in order to decrease error that arises in the prediction value, actually measuring the optical characteristics of the projection optical system, and correcting the prediction formula based on the measured values. In addition, Japanese Patent Laid-Open No. 2006-157020 proposes a method for changing a time interval for next actually measuring optical characteristics in accordance with an error between a measured value and a prediction value of optical characteristics of a projection optical system.

As recited by Japanese Patent Laid-Open No. 2006-157020, when determining the appropriateness of a prediction formula based on error between a measured value and a prediction value of optical characteristics, for example, in the case where a measurement error occurs in the measured value of the optical characteristics, it can be difficult to appropriately perform the determination of the appropriateness of the prediction formula. As a result, optical characteristic measurement that is not actually necessary may be performed, which can be disadvantageous for throughput.

SUMMARY OF THE INVENTION

The present invention provides an exposure method advantageous in throughput, for example.

According to one aspect of the present invention, there is provided an exposure method for repeatedly performing an exposure process for exposing a substrate via a projection optical system, the method comprising: a first exposure process for measuring optical characteristics of the projection optical system, and exposing the substrate while correcting the optical characteristics based on a result of the measurement; a second exposure process for exposing the substrate while correcting the optical characteristics based on a result of estimating the optical characteristics by a prediction formula, wherein the first exposure process includes determining a coefficient of the prediction formula from a result of measuring the optical characteristics up until the present, and judging whether the determined coefficient of the prediction formula has converged, and wherein in the exposure method, the first exposure process is repeatedly performed, and the second exposure process is started after the first exposure process where it is judged that the determined coefficient of the prediction formula has converged.

Further features of the present invention will become apparent from the following description of exemplary embodiments with reference to the attached drawings.

DESCRIPTION OF THE EMBODIMENTS

Figure 1:
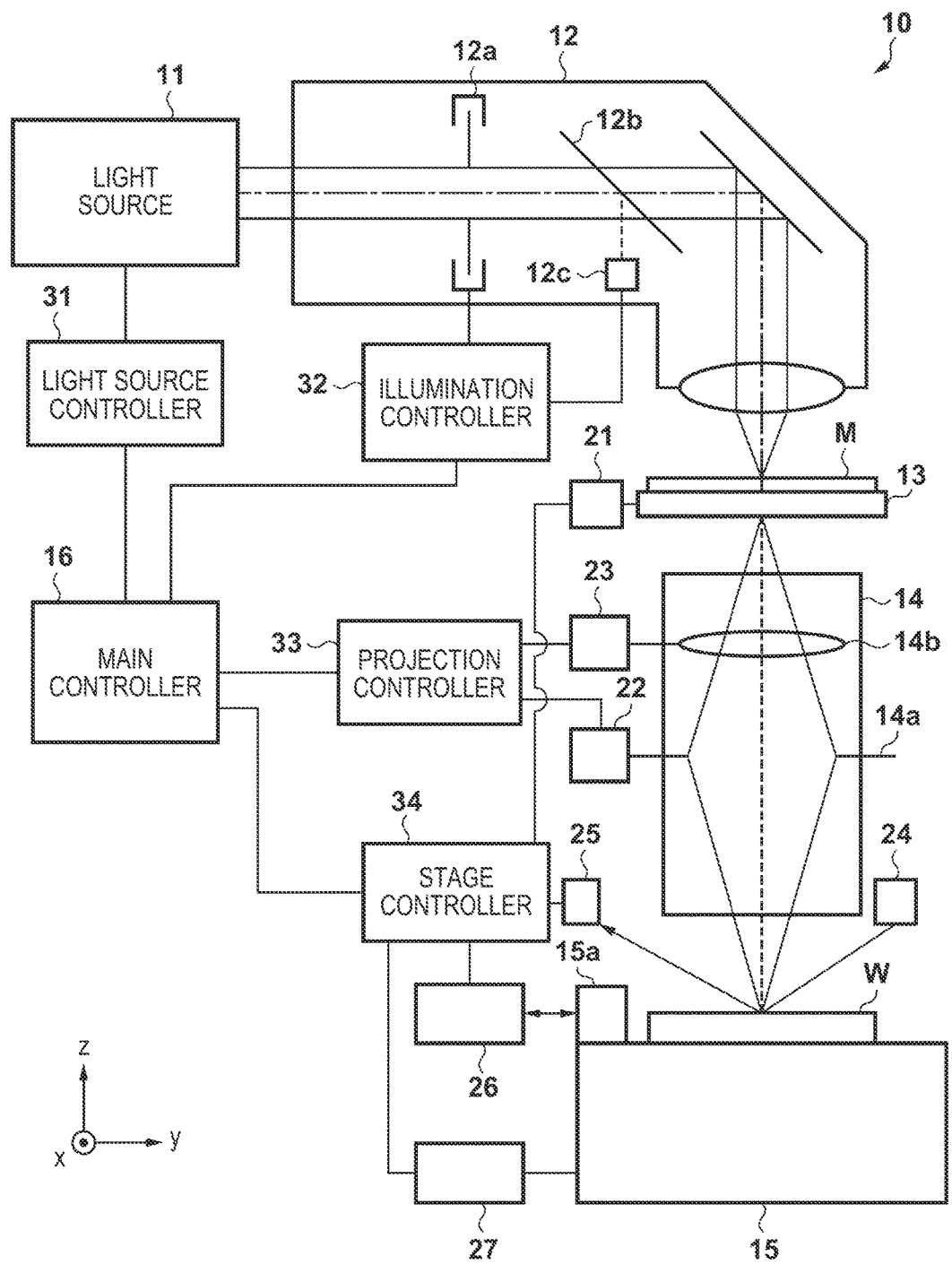
FIG. 1 is a schematic view illustrating a configuration of an exposure apparatus.

Exemplary embodiments of the present invention will be described below with reference to the accompanying drawings. Note that the same reference numerals denote the same members throughout the drawings, and a repetitive description thereof will not be given.

First Embodiment

Description is given regarding an exposure apparatus 10 of a first embodiment according to the present invention. FIG. 1 is a schematic view illustrating a configuration of the exposure apparatus 10 as an aspect of the present invention. The exposure apparatus 10 is an exposure apparatus (for example, a scanner or stepper) for repeatedly performing an exposure process for projecting a pattern of a mask M onto a substrate W via a projection optical system 14 to expose the substrate W. The exposure apparatus 10 has a light source 11, an illumination optical system 12, a mask stage driver 13, the projection optical system 14, a substrate stage 15, and a main controller 16. In addition, the exposure apparatus 10 has a mask stage driver 21, an aperture driver 22, a lens driving unit 23, a light projecting optical system 24, a detecting optical system 25, a laser interferometer 26, and a substrate stage driver 27. In FIG. 1, a direction parallel to the optical axis of the projection optical system 14 is set as a Z-axis, and directions orthogonal to the Z-axis are set as an X-axis and a Y-axis. In addition, the Y-axis is set as a direction in the paper surface, and the X-axis is set to a direction orthogonal to the paper surface.

The main controller 16, for example, has a CPU, a memory (a storage unit) or the like, and controls the entirety of the exposure apparatus 10 (each unit of the exposure apparatus 10) via a light source controller 31, an illumination controller 32, a projection controller 33, and a stage controller 34. In addition to controlling an exposure process for exposing a substrate W, the main controller 16 also controls an adjustment process for adjusting optical characteristics (also referred to as imaging characteristics or optical performance) of the projection optical system 14. It is assumed that the optical characteristics include at least one of image shift, focus, magnification, distortion aberration, astigmatism aberration, spherical aberration, coma aberration, and wavefront aberration, for example. Wavefront aberrations are represented as respective terms into which wavefront shapes are expanded by using a Zernike polynomial. In addition, these may be referred to collectively as an "aberration".

The light source 11, for example, encloses a gas such as KrF or ArF, and emits an exposure light (a laser beam) of a far ultraviolet band having a wavelength of 248 nm. Under control by the main controller 16, the light source controller 31 performs gas exchange operation control of the light source 11, control for wavelength stabilization, control for voltages in discharge and application, and the like. Light emitted from the light source 11 is shaped to a predetermined shape via a shaping optical system (not shown) in the illumination optical system 12, and is incident on an optical integrator (not shown). The optical integrator forms a large number of secondary light sources for illuminating the mask M by a uniform illumination distribution.

An aperture stop 12a in the illumination optical system 12 has an approximately circular shaped aperture. The illumination controller 32 sets (controls) the aperture diameter of the aperture stop 12a, in other words the numerical aperture (NA) of the illumination optical system 12, to a predetermined value. Because the value of a ratio of the numerical aperture of the illumination optical system 12 with respect to the numerical aperture of the projection optical system 14 is a coherence factor (a σ value), the illumination controller 32 sets (controls) the σ value by controlling the aperture diameter of the aperture stop 12a. In addition, a half-mirror 12b for reflecting a portion of light for illuminating the mask M is arranged on the light path of the illumination optical system 12. For example, a photosensor 12c for ultraviolet light is arranged on the light path of light reflected by the half-mirror 12b. The photosensor 12c is caused to generate an output corresponding to a strength (exposure energy) of light reflected by the half-mirror 12b.

The mask stage driver 13 chucks (holds) the mask M as a mask. If the exposure apparatus 10 is a scanning exposure apparatus for performing exposure while causing the mask M and the substrate W to scan relatively, there may be a configuration where the mask stage driver 13 can move in the Y-axis direction. In addition, a pattern to be transferred to the substrate W, for example a circuit pattern for a semiconductor device, is formed in the mask M.

The projection optical system 14 reduces the pattern of the mask M by a reduction scaling factor (for example, β=¼), and projects it onto one shot region of the substrate W where a photoresist is coated (supplied). An aperture stop 14a having an aperture in an approximately circular shape is arranged on a pupil plane (a Fourier transform plane with respect to the mask) of the projection optical system 14. The aperture diameter of the aperture stop 14a is set (controlled) to a predetermined value by the aperture driver 22 which includes a motor or the like. In addition, the lens driving unit 23 uses air pressure, a piezoelectric element, or the like to move or tilt an optical element 14b which configures a portion of a lens system of the projection optical system 14. By this, it is possible to control (correct) optical characteristics of the projection optical system 14 while maintaining a projection scaling factor of the projection optical system 14 satisfactorily.

The projection controller 33 controls the aperture driver 22 and the lens driving unit 23 under the control of the main controller 16. For example, the projection controller 33 controls the aperture diameter of the aperture stop 14a via the aperture driver 22 to thereby set the aperture diameter of the aperture stop 14a to a predetermined value. In addition, the projection controller 33 controls the position of the optical element 14b which configures the projection optical system 14, via the lens driving unit 23.

The substrate stage 15 is configured to be movable in a three-dimensional direction, and, in the present embodiment, can move in the Z-axis direction, which is a direction parallel to the optical axis of the projection optical system 14, and a plane (the X-Y plane) orthogonal to the z-axis direction. When the exposure apparatus 10 of the present embodiment is a scanning exposure apparatus, under control by the main controller 16 the stage controller 34 performs control to synchronize the mask stage driver 21 and the substrate stage driver 27 which each include a motor or the like. By this, it is possible to perform a scanning exposure by causing the mask stage driver 13 and the substrate stage 15 to move in synchronism.

A position in the X-Y plane of the substrate stage 15 can be controlled based on a detection result by the laser interferometer 26. The laser interferometer 26 can detect a position in the X-Y plane of the substrate stage 15 by measuring a distance between the laser interferometer 26 and a movable mirror 15a which is fixed to the substrate stage 15.

A position in the Z-axis direction of the substrate stage 15 can be controlled based on a detection result by a focus detection system. A focus detection system includes the light projecting optical system 24 and the detecting optical system 25. The light projecting optical system 24 projects onto the substrate W a plurality of light beams comprising non-exposure light that the photoresist coated on the substrate W is not photosensitive to, and focuses them on the substrate. The detecting optical system 25 includes a plurality of light-receiving elements for position detection that are arranged to be in association with the plurality of light beams reflected by the substrate W, and is configured so that reflecting points for light beams between the substrate and light-receiving surfaces of respective light-receiving elements are optically conjugate via an imaging optical system. By this, the detecting optical system 25 can detect the position (position shift) of a light beam incident on a respective light-receiving element as a height (position shift) of the substrate in a direction (Z-axis direction) parallel to the optical axis of the projection optical system 14.

[Regarding Prediction Formula]

In the exposure apparatus 10 with such a configuration, when exposing the substrate W by exposure light, a portion of the exposure light (the exposure energy) is absorbed in the projection optical system 14, and the optical characteristics of the projection optical system 14 can fluctuate by an influence of heat generated thereby. When the optical characteristics of the projection optical system 14 fluctuate, it can be difficult to transfer the pattern of the mask M to the substrate W with good accuracy. Accordingly, in the exposure apparatus 10, the optical characteristics (or a fluctuation amount of the optical characteristics) of the projection optical system 14 can be predicted by using a prediction formula (a model formula), and the optical characteristics of the projection optical system 14 can be controlled based on a prediction result. Description is given below regarding a prediction formula for predicting optical characteristics of a projection optical system in accordance with exposure energy irradiation.

Figure 2:
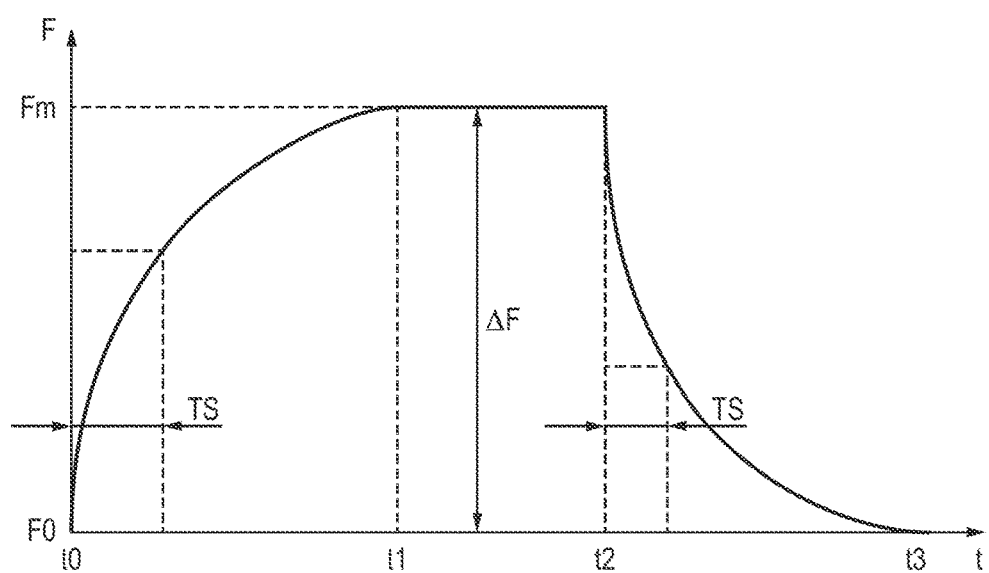
FIG. 2 is a view for illustrating an example of aberration fluctuation (optical characteristic fluctuation) of a projection optical system in accordance with exposure.

FIG. 2 is a view for illustrating an example of aberration fluctuation (optical characteristic fluctuation) of the projection optical system 14 in accordance with exposure. The abscissa indicates time t from the start of exposure, and the ordinate indicates an amount of aberration F at an image height (a position in the imaging plane) of the projection optical system 14. TS indicated in FIG. 2 is a time constant, and is equivalent to a thermal time constant under the heat transfer characteristics of the projection optical system 14. The time constant TS is a value unique to the projection optical system 14 and is a value that differs with respect to aberration, and thus can be obtained for each apparatus and for each aberration, such as when the projection optical system 14 is inspected. In addition, $\Delta F$ represents an aberration fluctuation amount, and is typically a value that differs for each image height. Here, aberration can include at least one of image shift, focus, magnification, distortion aberration, astigmatism aberration, spherical aberration, coma aberration, and wavefront aberration, for example.

An initial amount of aberration as an optical characteristic of the projection optical system 14 is set as an initial amount of aberration F0, and from the time t0 when irradiation of light with respect to the projection optical system is started, the aberration fluctuates with the passage of time, and stabilizes at a constant maximum amount of aberration Fm at a time t1. Subsequently, even if light continues to irradiate the projection optical system 14, energy absorbed as heat by the projection optical system 14 and thermal energy emitted from the projection optical system 14 reach parallel states, and the amount of aberration hardly changes from the maximum amount of aberration Fm. When exposure is stopped at a time t2, the amount of aberration returns to the original state with the passage of time, and becomes the initial amount of aberration F0 at a time t3.

The maximum amount of aberration Fm is expressed by Equation (1), using actual exposure energy Q determined in accordance with exposure conditions (exposure time, exposure amount, scanning speed, exposure region information, or the like), and an aberration fluctuation amount K per unit amount of light (unit exposure energy). Letting the aberration fluctuation amount at a time t be $\Delta F_k$, then an aberration fluctuation amount $\Delta F1_{k+1}$ after exposure for time $\Delta t$ therefrom can be approximated as in Equation (2) in accordance with the maximum amount of aberration Fm and a time constant TS saved for each aberration. Similarly, it can be approximately as in Equation (3) if exposure is not performed for time $\Delta t$.

$$Fm = K \times Q \quad (1)$$

$$\Delta F_{k+1} = \Delta F_k + Fm \times (1 - \exp(-\Delta t/TS)) \quad (2)$$

$$\Delta F_{k+1} = \Delta F_k \times \exp(-\Delta t/TS) \quad (3)$$

By modelling the curve illustrated in FIG. 2 by the functions of the above Equations (1) through (3), it is possible to predict aberration fluctuation of the projection optical system 14 that can occur in accordance with exposure heat. In other words, a fluctuation characteristic of aberration of the projection optical system 14 includes an exposure model that represents aberration fluctuation during irradiation of exposure light with respect to the projection optical system 14, and a non-exposure model that represents aberration fluctuation in a state where this irradiation has stopped, the former being represented by Equation (2) and the latter by Equation (3). Note that the foregoing Equations (1) through (3) are examples, and modelling may be performed using other equations.

Here, the fluctuation amount of overall optical characteristics in the projection optical system 14 can be predicted by deriving a sum total of aberration fluctuation amounts $\Delta F$ predicted for each of a plurality of indexes (aberrations) having mutually different time constants. In other words, by totaling the amount of aberration $\Delta F$ predicted for each aberration in accordance with the foregoing Equation (2) or Equation (3) using a time constant TS that differs for each aberration, it is possible to derive a fluctuation amount of overall optical characteristics in the projection optical system 14. For example, in a case of paying attention to an aberration 1 having a time constant TS1 and an aberration 2 having a time constant TS2 different to the time constant TS1, aberration fluctuation amounts $\Delta F1_k$ and $\Delta F2_k$ are respectively predicted by Equation (2) (or Equation (3)) for the aberration 1 and the aberration 2 respectively. By totaling the aberration fluctuation amounts $\Delta F1_k$ and $\Delta F2_k$ ($\Delta F1_k + \Delta F2_k$), it is possible to derive the fluctuation amount of overall optical characteristics in the projection optical system 14. In the present embodiment, although description is given regarding two types of aberration having mutually different time constants TS, there is no limitation to this, and it is similar even with three or more types of aberration having mutually different time constants.

[Regarding Exposure Method]

Next, description is given regarding an exposure method of the present embodiment. In the exposure method of the present embodiment, an exposure process for transferring a pattern of the mask M onto the substrate via the projection optical system 14 is repeatedly performed for each shot region, for each substrate, or for each lot. As an exposure process that is performed at first, a first exposure process for measuring optical characteristics of the projection optical system 14 and exposing the substrate while correcting the optical characteristics of the projection optical system 14 based on the result of measurement is repeatedly performed. In each first exposure process, a coefficient (the maximum amount of aberration Fm in the foregoing Equation (2)) of the prediction formula is determined from optical characteristic measurement results accumulated up until the present, and it is judged whether the determined coefficient has converged. After the first exposure process where it is judged that the coefficient of the prediction formula has converged, a second exposure process for exposing the substrate W while correcting the optical characteristics of the projection optical system 14 based on a prediction result of the optical characteristics in accordance with the prediction formula is performed.

Such an exposure method is advantageous in throughput the earlier a timing at which there is a transition from the first exposure process which accompanies measurement of the optical characteristics of the projection optical system 14 to the second exposure process for predicting the optical characteristics in accordance with the prediction formula. Accordingly, in each first exposure process, it is desirable to appropriately perform the judgement of whether the coefficient of the prediction formula has converged. However, for example, in a conventional example where convergence of a coefficient of a prediction formula is judged based on error between a prediction value of optical characteristics and a measured value, when a measurement error occurs in the measured value of the optical characteristics, judgement that the coefficient has converged is not made, and a timing for transition to the second exposure process is delayed. Accordingly, in the present embodiment, a judgement of whether the coefficient has converged is performed in accordance with the coefficient of the prediction formula which is determined from measurement results of optical characteristics up until the present.

Figure 3:
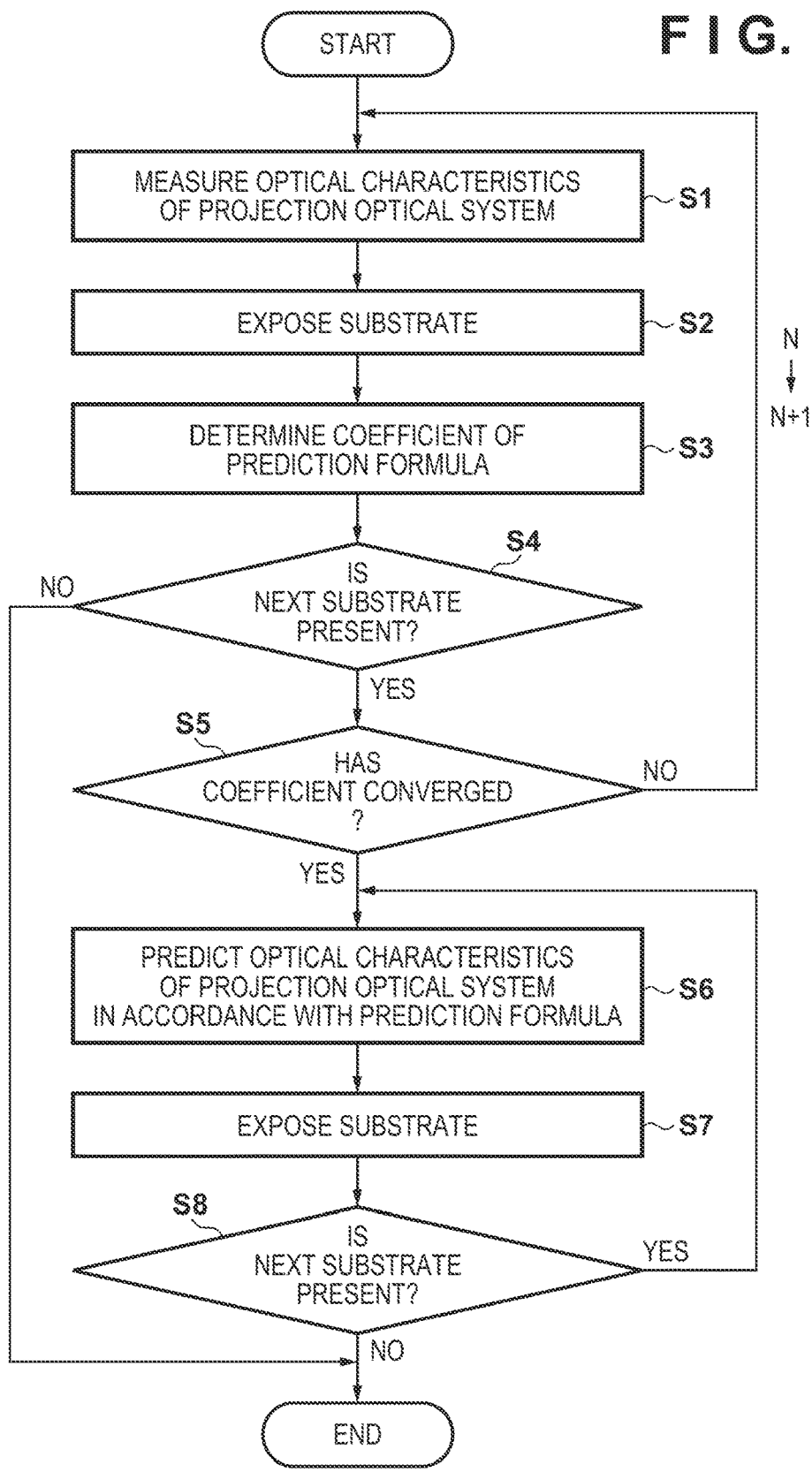
FIG. 3 is a flowchart illustrating an exposure method of an embodiment.

FIG. 3 is a flowchart illustrating an exposure method of an embodiment. A program for executing each step of the flowchart illustrated in FIG. 3 is stored in a storage unit, and the main controller 16 reads the program stored in the storage unit to execute each step of the flowchart illustrated in FIG. 3.

Firstly, the main controller 16 controls a measurement process for measuring the optical characteristics of the projection optical system 14, and controls the first exposure process for exposing the substrate W (a shot region) while correcting the optical characteristics of the projection optical system 14 based on a result of the measurement. The main controller 16 then causes the exposure apparatus to repeatedly execute the measurement process and the first exposure process. The first exposure process may include step S1 through step S5.

In step S1, the exposure apparatus 10 measures optical characteristics of the projection optical system 14 for each of a plurality of indexes (aberrations of the projection optical system 14) which have mutually different time constants TS (measurement step). If correction of the optical characteristics of the projection optical system 14 has been performed in a previous ((N−1)-th) first exposure process, in a measurement step in the current (N-th) first exposure process, measurement is made of an amount of fluctuation of the optical characteristics from the previous first exposure process.

Figure 4:
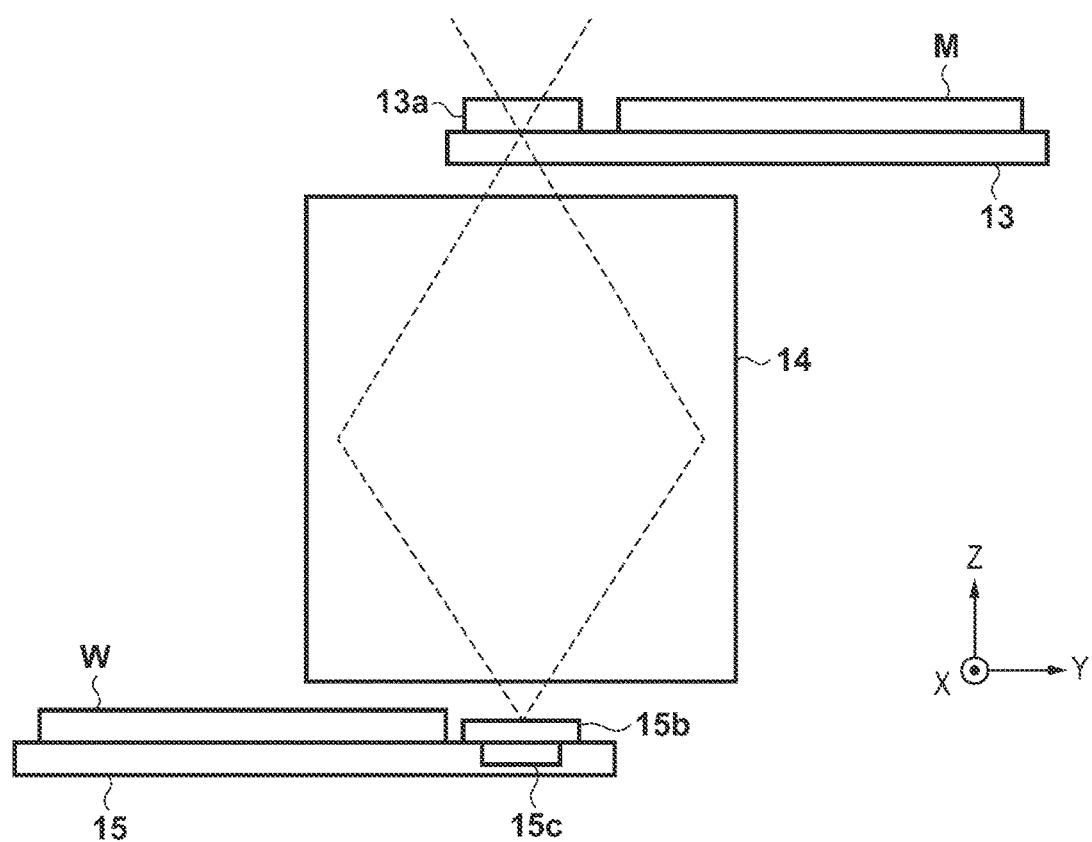
FIG. 4 is a view for illustrating a measurement method of optical characteristics of a projection optical system.

Here, measurement of the optical characteristics of the projection optical system 14 can be performed by detecting a relative position between a mask-side mark 13a provided on the mask stage driver 13 and a substrate-side mark 15b provided on the substrate stage 15, as illustrated by FIG. 4, for example. Specifically, the mask-side mark 13a and the substrate-side mark 15b are each configured as a slit (an aperture) that allows light from the illumination optical system 12 to pass through. A sensor 15c (a measurement device) for detecting light emitted from the illumination optical system 12 that passes through the mask-side mark 13a, the projection optical system 14, and the substrate-side mark 15b is provided on the substrate stage 15. The main controller 16 measures the relative position between the mask-side mark 13a and the substrate-side mark 15b when a strength of light detected by the sensor 15c is maximum for each image height of the projection optical system 14, while driving the mask stage driver 13 and the substrate stage 15 (X-, Y- and Z-axis directions). By this it is possible to measure the optical characteristics of the projection optical system 14.

In step S2, the exposure apparatus 10 exposes a target substrate W (a target shot region) while correcting the optical characteristics of the projection optical system 14 based on a measurement result obtained in the measurement step (S1). If correction of the optical characteristics of the projection optical system 14 has been performed in a previous ((N−1)-th) first exposure process, in the current (N-th) first exposure process, the optical characteristics of the projection optical system are further corrected based on the fluctuation amount of the optical characteristics measured in step S1. Correction of the optical characteristics of the projection optical system 14 can be performed by tilting or moving, in an X-axis, Y-axis, or Z-axis direction, the optical element 14b of the projection optical system 14 by the lens driving unit 23, for example In addition, correction of the optical characteristics of the projection optical system 14 may be performed by changing a relative scanning speed between the mask M and the substrate W or by respectively tilting the mask M and the substrate W by the mask stage driver 13 and the substrate stage 15.

In step S3, the main controller 16 determines the coefficient of the prediction formula from a plurality of measurement results obtained in the measurement step (S1) of the first exposure process until the present (a current time), for each of a plurality of indexes whose time constants TS are mutually different (determination step). The coefficient of the prediction formula can be determined from Equations (1) through (3) previously described, by taking the total of the fluctuation amount of the optical characteristics respectively measured in the first exposure process up until the previous time (the (N−1)-th time) as $\Delta F_k$, and taking the fluctuation amount of the optical characteristics measured in the first exposure process of the current time (the N-th time) as $\Delta F1_{k+1}$, for example. The coefficient of the prediction formula determined in this way is stored in a storage unit.

Figure 5A:
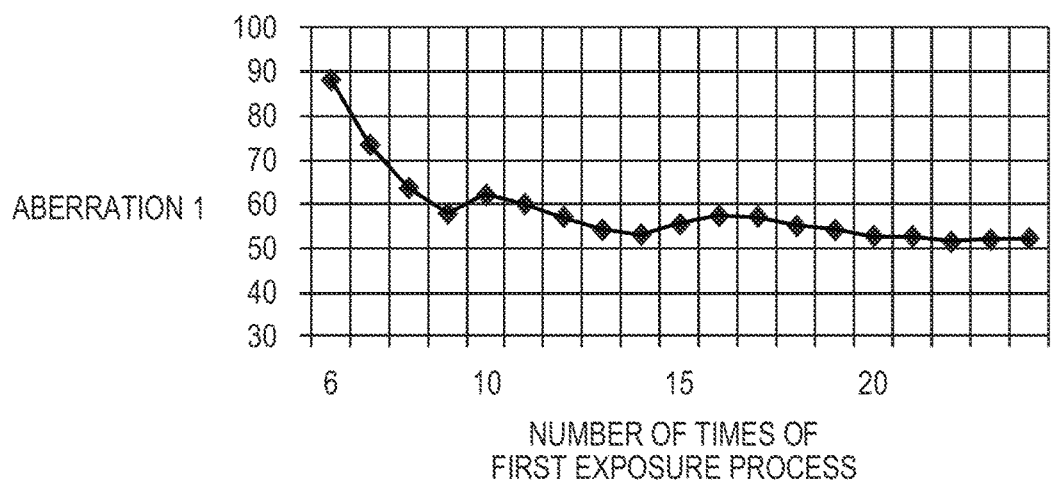
FIG. 5A is a view for illustrating a coefficient of a prediction formula that is determined by the first exposure process of each time, for an index that has a time constant TS1.
Figure 5B:
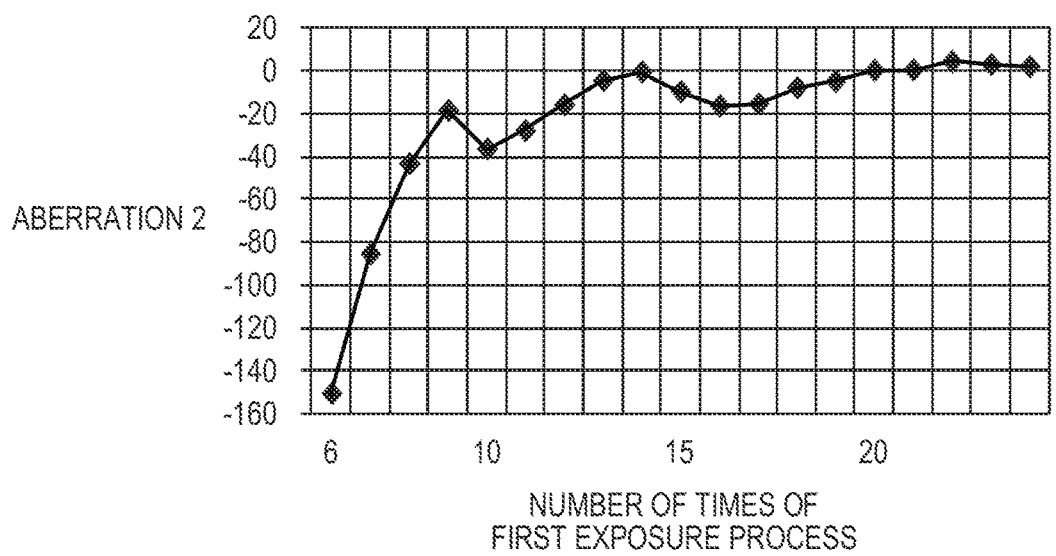
FIG. 5B is a view for illustrating a coefficient of a prediction formula that is determined by the first exposure process of each time, for an index that has a time constant TS2.

FIG. 5A and FIG. 5B are examples that illustrate the coefficient of the prediction formula that is determined by the determination step in the first exposure process of each time, for each of the plurality of indexes (aberrations) having mutually different time constants TS. FIG. 5A illustrates the coefficient of the prediction formula for an index (an aberration 1) having a time constant TS1, and FIG. 5B illustrates the coefficient of the prediction formula for an index (an aberration 2) having a time constant TS2 different to the time constant TS1. In addition, in FIG. 5A and FIG. 5B, the abscissa represents the number of times of the first exposure process, and the ordinate indicates the coefficient of the prediction formula determined from a plurality of measurement results respectively obtained by the measurement steps of the first exposure processes thus far. For example, in FIG. 5A and FIG. 5B, when the number of times N of the first exposure process is "9" (N=9), coefficients for the prediction formula determined from nine measurement results respectively obtained from the measurement step of the first through ninth times of the first exposure process are illustrated.

In step S4, the main controller 16 judges whether there is a substrate W for which to next perform an exposure process (hereinafter a subsequent substrate W). The processing proceeds to step S5 when there is a subsequent substrate W, and the processing ends when there is no subsequent substrate W.

In step S5, in accordance with the coefficient of the prediction formula that was determined in the determination step, the main controller 16 judges whether the coefficient of the prediction formula has converged (S3) (judgement step). Specifically, based on a comparison between the coefficient determined in the first exposure process of the current time (the N-th time) and a coefficient determined in the first exposure process of the past (for example, a (N−1)-th time), the main controller 16 performs a judgement (hereinafter, a convergence judgement) for whether the coefficient determined for the current time satisfies a convergence condition. Details of the convergence judgement are described later. When it is judged that the coefficient of the prediction formula has not satisfied the convergence condition, the processing returns to step S1, and a first exposure process is performed with respect to a subsequent substrate W.

Meanwhile, in the case where it is judged that the coefficient of the prediction formula satisfies the convergence condition, the processing proceeds to step S6, and, based on a result of predicting the optical characteristics of the projection optical system 14 in accordance with the prediction formula, the second exposure process for exposing the substrate (a shot region) while correcting the optical characteristic of the projection optical system 14 is repeatedly performed. The second exposure process includes step S6 through step S8, and does not include a measurement step, a determination step, or a judgement step. Note that the prediction result can be predicted by using a latest coefficient when it is judged that the coefficient of the prediction formula satisfies the convergence condition.

In step S6, the main controller 16 predicts the optical characteristics of the projection optical system 14 in accordance with the prediction formula which includes the coefficient judged as satisfying the convergence condition in the judgement step (S5) (a prediction step). In step S7, the main controller 16 exposes a target substrate W (a target shot region) while correcting the optical characteristics of the projection optical system 14 based on the prediction result of the prediction step (step S0). In step S8, the main controller 16 judges whether there is a subsequent substrate W. The processing proceeds to step SO when there is a subsequent substrate W, and the processing ends when there is no subsequent substrate W.

[Regarding Convergence Conditions]

Next, description is given regarding an embodiment for performing the judgement of whether the coefficient of the prediction formula has converged for each of two indexes (an aberration 1 and an aberration 2) which have mutually different time constants TS, in the judgement step (S5) described above. In the following embodiment, F1(N) and F2(N) respectively represent a coefficient of the prediction formula for the aberration 1 and the aberration 2 which are determined by the N-th first exposure process. F1(N−1) and F2(N−1) respectively represent a coefficient of the prediction formula for the aberration 1 and the aberration 2 which are determined by the (N−1)-th first exposure process. F1a(N) and F2a(N) respectively represent a moving average value of a coefficient of the prediction formula for the aberration 1 and the aberration 2 determined in the 1st through N-th first exposure processes. F1a(N−1) and F2a(N−1) respectively represent a moving average value of a coefficient of the prediction formula for the aberration 1 and the aberration 2 determined in the 1st through (N−1)-th first exposure processes.

First Embodiment

In the first embodiment, the convergence judgement is performed based on whether a difference between the coefficient determined in the current (the N-th) first exposure process and a coefficient determined in a first exposure process in the past (for example, the (N−1)-th time) is less than or equal to a permitted value. The convergence condition of the first embodiment can be represented in the following way. A permitted value 1 and a permitted value 2 are respectively values set in advance for the aberration 1 and the aberration 2. For example, when the permitted value 1 is set to 0.3 nm and the permitted value 2 is set to 0.6 nm, in the example illustrated in FIG. 5A and FIG. 5B, the convergence condition is satisfied for both of the aberration 1 and the aberration 2 when the number of times of the first exposure process is "22" (N=22).

$|F1(N-1)-F1(N)| <$ permitted value 1, and $|F2(N-1)-F2(N)| <$ permitted value 2

Second Embodiment

In the second embodiment, the convergence judgement is performed based on whether a difference between a total value of coefficients determined for each index (aberration) by the current (N-th) first exposure process and a total value of coefficients determined for each index (aberration) by a first exposure process in the past (a (N−1)-th time) is less than or equal to a permitted value. The convergence condition of the second embodiment can be represented in the following way. A permitted value is a value that is set in advance.

$|\{F1(N-1)+F2(N-1)\}-\{F1(N)+F2(N)\}| <$ permitted value

Third Embodiment

In the third embodiment, the convergence judgement is performed based on a difference between a moving average value of the coefficients determined in the first exposure processes of a plurality of times (first through N-th times) that includes the current first exposure process and a moving average value of the coefficients determines by first exposure processes of a plurality of times in the past (first through (N−1)-th times). The convergence condition in the convergence judgement of the second embodiment can be represented in the following way. A permitted value 1a and a permitted value 2a are respectively values set in advance for the aberration 1 and the aberration 2. For the third embodiment, the judgement step (S5) can be omitted from the first and second first exposure processes because it is executable from the third first exposure process.

$|F1a(N-1)-F1a(N)| <$ permitted value 1a, and $|F2a(N-1)-F2a(N)| <$ permitted value 2a Fourth Embodiment In the fourth embodiment, a total value for moving average values of a plurality of coefficients obtained for each index in the first exposure processes of a plurality of times (first through N-th) that includes the current first exposure process is derived. A total value for moving average values of a plurality of coefficients obtained for each index in the first exposure processes of a plurality of times (first through (N−1)-th) of the past is derived. The convergence judgement is performed based on a difference between these total values. The convergence condition of the fourth embodiment can be represented in the following way. A permitted value is a value that is set in advance.

$|\{F1a(N-1)+F2a(N-1)\}-\{F1a(N)+F2a(N)\}| <$ permitted value

[Effect]

Figure 6:
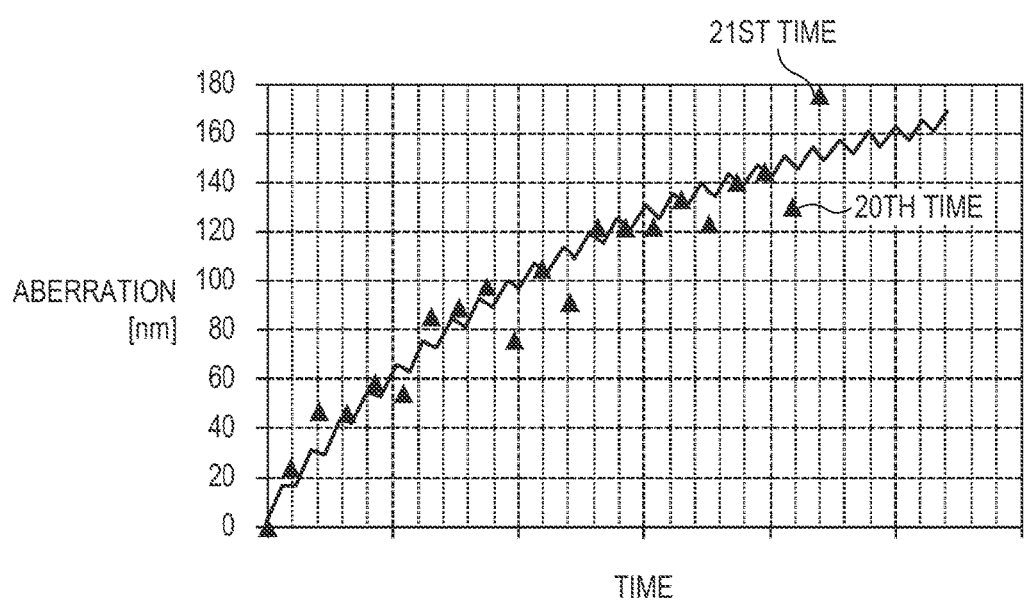
FIG. 6 is a view for illustrating a prediction value and a measured value for optical characteristics of a projection optical system.

Next, description is given regarding effects (advantages) of the convergence judgement according to the present embodiment, while making a comparison with a conventional example where convergence of the coefficient of the prediction formula is judged based on an error between a measured value and a prediction value of optical characteristics. FIG. 6 is a view for illustrating a prediction value in accordance with a prediction formula and a measured value for optical characteristics of the projection optical system 14. In FIG. 6, the solid line indicates prediction values, and the plot (Δ) indicates measured values. The abscissa of FIG. 6 indicates and amount of time (time) since the start of exposure, and the ordinate indicates optical characteristics (aberration) of the projection optical system.

For example, if the difference between a prediction value and a measured value obtained in a 20th exposure process (first exposure process) is 17 nm, when a threshold value is hypothetically set to 15 nm, the convergence condition is not satisfied in a conventional example. Accordingly, the first exposure process that involves measurement of the optical characteristics is performed as the 21st exposure process. In addition, in a case where a measurement error occurs in the measured value obtained by the 21st exposure process (first exposure process) and a difference between the measured value and the prediction value is 24 nm, a first exposure process as the 22nd exposure process is performed.

In contrast, with the method of the present embodiment, in the exposure process of each time, the coefficient of the prediction formula is determined from a plurality of measured values obtained thus far, and the determined coefficients are compared to each other to perform the convergence judgement. Accordingly, even if a measurement error occurs in the measured value, it is possible to reduce the influence of measurement error in accordance with an effect of averaging of a plurality of measured values. Specifically, in the 20th first exposure process, the coefficient of the prediction formula is derived from 20 measured values obtained in the first through 20th first exposure processes. In addition, in the 21st first exposure process, the coefficient of the prediction formula is derived from 21 measured values obtained in the first through 21st first exposure processes. Because coefficients derived from these pluralities of measured values are compared with each other, an influence from measurement error is less likely, and it is possible to perform an appropriate convergence judgement. In the example illustrated in FIG. 6, the difference between the coefficient of the prediction formula that is obtained in the 20th first exposure process and the coefficient of the prediction formula that is determined in the 21st first exposure process is 0.3 nm, satisfying the convergence condition. Accordingly, the second exposure process that does not involve measurement of the optical characteristics can be performed as the 22nd exposure process.

Embodiment of Method of Manufacturing Article

A method of manufacturing an article according to an embodiment of the present invention is suitable to manufacturing an article such as an element having a microstructure or micro-device such as a semiconductor device, for example. The method of manufacturing an article of the present embodiment includes a step for using the foregoing exposure apparatus to form a latent image pattern on a photosensitive agent coated onto a substrate (a step for exposing a substrate), and a step for developing (processing) the substrate on which the latent image pattern was formed in the corresponding step. Furthermore, the corresponding manufacturing method includes other well-known steps (such as oxidation, film formation, vapor deposition, doping, planarization, etching, resist stripping, dicing, bonding, and packaging). The method of manufacturing an article of the present embodiment is advantageous in at least one of capabilities, quality, productivity, and manufacturing cost for the article in comparison to a conventional method.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-151033 filed on Aug. 3, 2017, which is hereby incorporated by reference herein in its entirety.

What is claimed is:

1. An exposure method for repeatedly performing an exposure process for exposing a substrate via a projection optical system, the method comprising:
    a first exposure process for measuring optical characteristics of the projection optical system, and exposing the substrate while correcting the optical characteristics based on a result of the measurement;
    a second exposure process for exposing the substrate while correcting the optical characteristics based on a result of estimating the optical characteristics by a prediction formula,
    wherein the first exposure process includes determining a coefficient of the prediction formula from a result of measuring the optical characteristics up until the present, and judging whether the determined coefficient of the prediction formula has converged, and
    wherein in the exposure method, the first exposure process is repeatedly performed, and the second exposure process is started after the first exposure process where it is judged that the determined coefficient of the prediction formula has converged.

2. The exposure method according to claim 1, wherein the judging is performed based on a comparison between the coefficient determined in the present first exposure process and the coefficient determined in the past first exposure process.

3. The exposure method according to claim 1, wherein the judging is performed based on a difference between the coefficient obtained in the present first exposure process and the coefficient obtained in the past first exposure process.

4. The exposure method according to claim 1, wherein the judging is performed based on a difference between a moving average value of the coefficients obtained in the multiple first exposure processes not including the present first exposure process, and a moving average value of the coefficients obtained in the multiple first exposure process including the present first exposure process.

5. The exposure method according to claim 1, wherein
the optical characteristic includes a plurality of indexes whose time constants are different from each other, and
the plurality of indexes include at least one of an image shift, a focus, a magnification, a distortion aberration, an astigmatism aberration, a spherical aberration, and a coma aberration.

6. The exposure method according to claim 5, wherein, in the determining, the coefficient of the prediction formula is determined for each index.

7. The exposure method according to claim 5, wherein
in the determining, the coefficient of the prediction formula is determined for each index, and
the judging is performed based on a difference between a total value of the coefficients obtained for each index in the present first exposure process and a total value of the coefficients obtained for each index in the past first exposure process.

8. The exposure method according to claim 5, wherein
in the determining, the coefficient of the prediction formula is determined for each index, and
the judging is performed based on a difference between a total value for a moving average value for the coefficients obtained for each index in the multiple first exposure processes not including the present first exposure process, and a total value for a moving average value for the coefficients obtained for each index in the multiple first exposure processes including the present first exposure process.

9. The exposure method according to claim 1, wherein the second exposure process does not include measuring the optical characteristics, the determining, and the judging.

10. The exposure method according to claim 1, wherein, in the second exposure process, a substrate is exposed while correcting the optical characteristics based on a result of predicting the optical characteristics using the latest coefficient for when it is judged that the determined coefficient of the prediction formula has converged.

11. An exposure apparatus which repeatedly performs an exposure process for exposing a substrate via a projection optical system, the apparatus comprising:

a measurement device configured to measure optical characteristics of the projection optical system; and
a controller configured to, after repeatedly performing a first exposure process for exposing the substrate while correcting the optical characteristics based on a result of causing the measurement device to measure the optical characteristics, start a second exposure process for exposing the substrate while correcting the optical characteristics based on a result of predicting the optical characteristics in accordance with a prediction formula,
wherein the first exposure process includes determining a coefficient of the prediction formula from a result of measuring the optical characteristics up until the present, and judging whether the determined coefficient of the prediction formula has converged, and
wherein the controller is configured to start the second exposure process after the first exposure process where it is judged that the determined coefficient of the prediction formula converged.

12. A method of manufacturing an article, the method comprising:
exposing a substrate using an exposure method;
developing the exposed substrate; and
processing the developed substrate to manufacture the article,
wherein the exposure method repeatedly performs an exposure process for exposing a substrate via a projection optical system, and includes:
a first exposure process for measuring optical characteristics of the projection optical system, and exposing the substrate while correcting the optical characteristics based on a result of the measurement;
a second exposure process for exposing the substrate while correcting the optical characteristics based on a result of estimating the optical characteristics by a prediction formula,
wherein the first exposure process includes determining a coefficient of the prediction formula from a result of measuring the optical characteristics up until the present, and judging whether the determined coefficient of the prediction formula has converged, and
wherein in the exposure method, the first exposure process is repeatedly performed, and the second exposure process is started after the first exposure process where it is judged that the determined coefficient of the prediction formula has converged.

* * * * *